(12) United States Patent
Nakajima et al.

(10) Patent No.: US 12,438,033 B2
(45) Date of Patent: Oct. 7, 2025

(54) SUBSTRATE PLACING METHOD AND SUBSTRATE PLACING MECHANISM

(71) Applicant: Tokyo Electron Limited, Tokyo (JP)

(72) Inventors: Koichi Nakajima, Yamanashi (JP); Kentaro Asakura, Yamanashi (JP); Yasuyuki Kagaya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 409 days.

(21) Appl. No.: 17/964,708

(22) Filed: Oct. 12, 2022

(65) Prior Publication Data

US 2023/0122317 A1 Apr. 20, 2023

(30) Foreign Application Priority Data

Oct. 20, 2021 (JP) ................. 2021-171591

(51) Int. Cl.
*H01L 21/687* (2006.01)
*H01L 21/67* (2006.01)
*H01L 21/683* (2006.01)

(52) U.S. Cl.
CPC .. *H01L 21/68742* (2013.01); *H01L 21/67103* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 9,799,548 B2 | 10/2017 | Sheelavant et al. | |
| 2011/0222038 A1* | 9/2011 | Yamashita | H01J 37/32192 |
| | | | 355/72 |
| 2014/0265091 A1 | 9/2014 | Sheelavant et al. | |

FOREIGN PATENT DOCUMENTS

| | | |
|---|---|---|
| JP | 2005-050904 A | 2/2005 |
| JP | 2010-147294 A | 7/2010 |
| KR | 10-2007-0025092 A | 3/2007 |
| KR | 10-2015-0130261 A | 11/2015 |
| KR | 10-2020-0074002 A | 6/2020 |
| WO | WO 2014/149957 A1 | 9/2014 |

* cited by examiner

*Primary Examiner* — Brian D Keller
*Assistant Examiner* — Jason Khalil Hawkins
(74) *Attorney, Agent, or Firm* — Fenwick & West LLP

(57) ABSTRACT

There is a substrate placing method for placing a substrate on a placing surface of a placing table in a chamber of a substrate processing apparatus for processing a substrate, the placing table having the placing surface on which a substrate is placed and a tapered surface for guiding the substrate disposed at an outer periphery of the placing surface, the method comprising, locating a lift pin to a substrate transfer position over the placing surface, the lift pin being capable of protruding from and retracting below the placing surface, and transferring the substrate onto the lift pin; lowering the lift pin, on which the substrate is placed, to a substrate placing position lower than the placing surface; and raising the lift pin by a short distance and then returning the lift pin to the substrate placing position.

9 Claims, 9 Drawing Sheets

SUBSTRATE PLACING METHOD AND SUBSTRATE PLACING MECHANISM

CROSS-REFERENCE TO RELATED APPLICATIONS

This application claims priority to Japanese Patent Application No. 2021-171591 filed on Oct. 20, 2021, the entire contents of which are incorporated herein by reference.

TECHNICAL FIELD

The present disclosure relates to a substrate placing method and a substrate placing mechanism.

BACKGROUND

For example, in the case of processing a substrate such as a semiconductor wafer, the substrate is placed on a placing table having a horizontal placing surface. Japanese Laid-open Patent Publication No. 2005-50904 discloses a placing table having a substrate placing surface at a bottom portion of a recess and a tapered surface for guiding a substrate to the substrate placing surface at an outer periphery of the substrate placing surface. In this placing table, the backside of the substrate is placed in a non-parallel manner to the substrate placing surface to prevent horizontal displacement of the substrate.

SUMMARY

The present disclosure provides a substrate placing method and a substrate placing mechanism capable of placing a substrate at a desired position even when the substrate is horizontally displaced and caught in an undesired position in the case of placing the substrate on a placing surface of a placing table.

In accordance with an aspect of the present disclosure, there is a substrate placing method for placing a substrate on a placing surface of a placing table in a chamber of a substrate processing apparatus for processing a substrate, the placing table having the placing surface on which a substrate is placed and a tapered surface for guiding the substrate disposed at an outer periphery of the placing surface, the method comprising, locating a lift pin to a substrate transfer position over the placing surface, the lift pin being capable of protruding from and retracting below the placing surface, and transferring the substrate onto the lift pin; lowering the lift pin, on which the substrate is placed, to a substrate placing position lower than the placing surface; and raising the lift pin by a short distance and then returning the lift pin to the substrate placing position, wherein when an edge of the substrate is caught on the tapered surface while lowering the lift pin from the substrate transfer position to the substrate placing position, the state in which the edge is caught on the tapered surface is released and the substrate is guided to the placing surface, by the raising the lift pin by the short distance and then returning the lift pin to the substrate placing position.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described below with reference to the accompanying drawings.

<Substrate Placing Mechanism>

Figure 1:
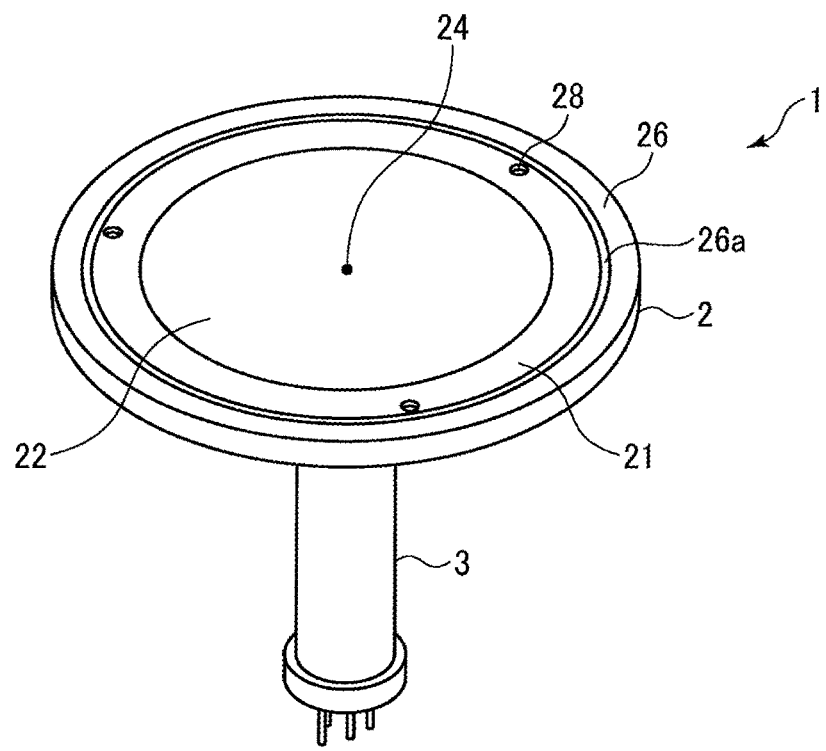
FIG. 1 is a perspective view showing an example of a substrate placing mechanism for performing a substrate placing method according to an embodiment.
Figure 2:
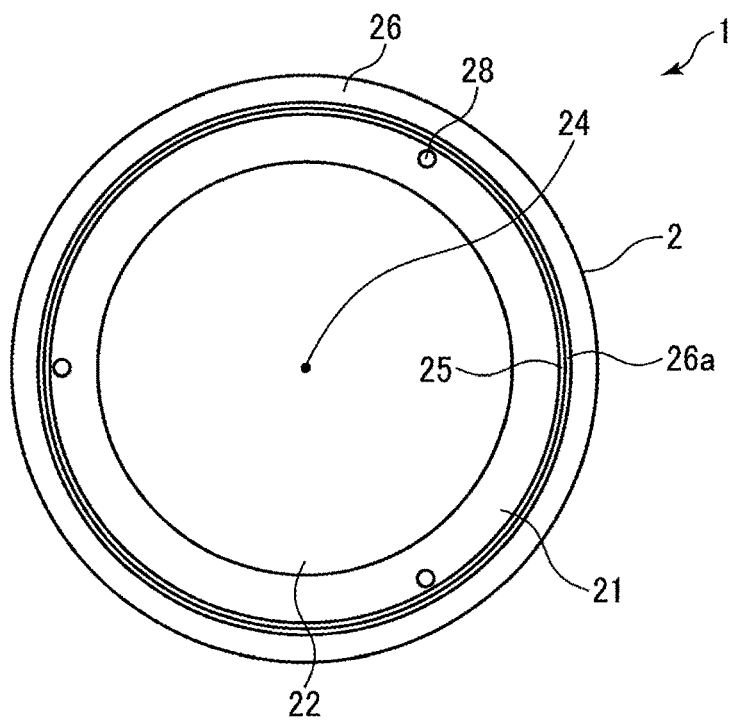
FIG. 2 is a plan view showing an example of the substrate placing mechanism for performing a substrate placing method according to the embodiment.
Figure 3:
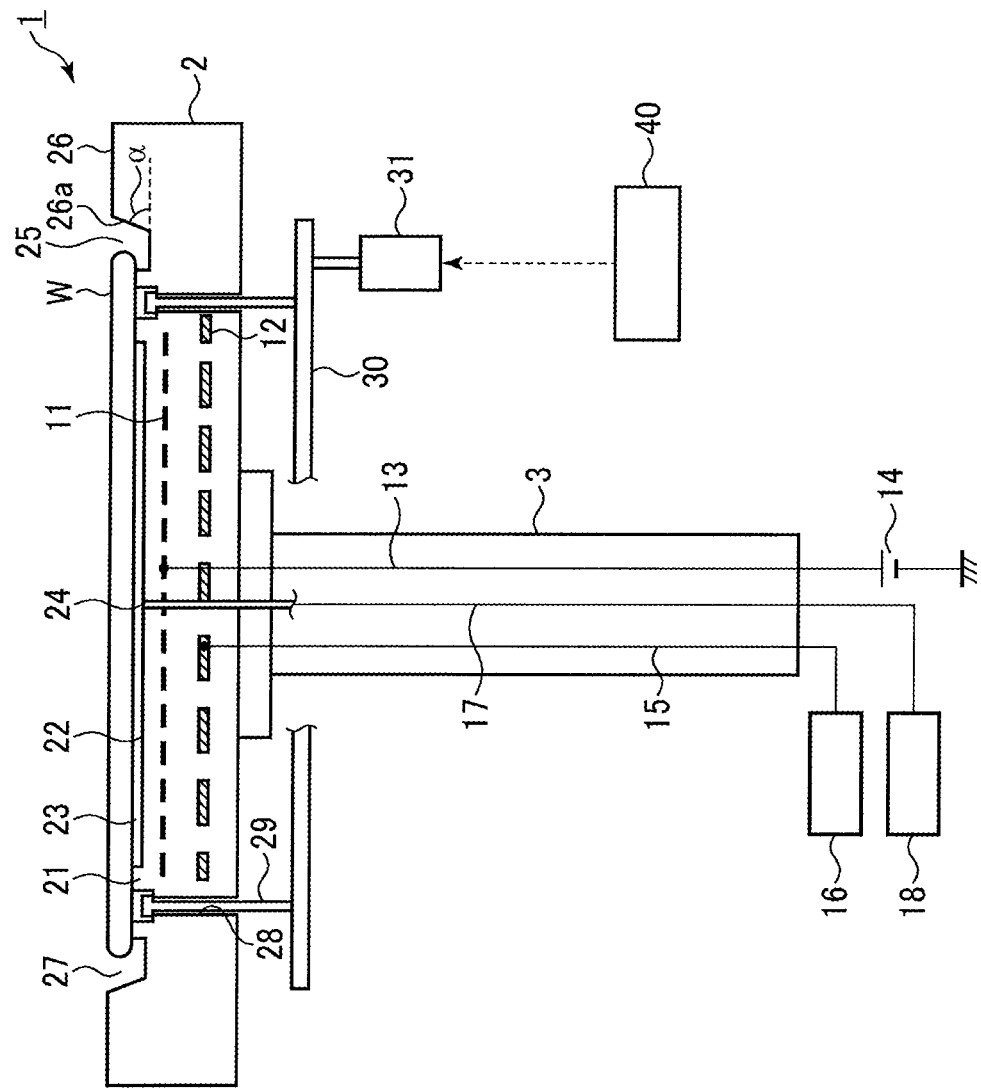
FIG. 3 is a cross-sectional view showing an example of the substrate placing mechanism for performing a substrate placing method according to the embodiment.

First, an example of a substrate placing mechanism for performing a substrate placing method according to one embodiment will be described. FIG. 1 is a perspective view showing a substrate placing mechanism. FIG. 2 is a plan view of the substrate placing mechanism. FIG. 3 is a cross-sectional view of the substrate placing mechanism.

The substrate placing mechanism 1 places a substrate in a chamber maintained in a vacuum state in a substrate processing apparatus for processing a substrate. Hereinafter, a case in which a semiconductor wafer (hereinafter, simply referred to as "wafer") is used as an example of the substrate will be described. Although the substrate processing apparatus is not particularly limited, a film forming apparatus for forming a film by CVD or ALD may be used. CVD or ALD may be plasma CVD or plasma ALD.

The substrate placing mechanism 1 has a placing table 2 on which the wafer W is placed, and a supporting member 3 that is attached to the center of the back surface of the placing table 2 to extend downward.

The placing table 2 is made of a dielectric material, e.g., ceramic such as aluminum nitride (AlN) or the like. An attracting electrode 11 for attracting the wafer W is embedded in the placing table 2 near the surface of the placing table 2, and constitutes an electrostatic chuck. The attracting electrode 11 is made of Mo, for example, and has a mesh shape, for example. A DC power supply 14 is connected to the attracting electrode 11 through a power supply line 13, and applies a DC voltage to the attracting electrode 11 so that the wafer W is attracted and held on the attracting electrode 11. The DC power supply 14 can be turned ON/OFF by a switch (not shown). The attracting electrode 11 also functions as a ground electrode for plasma.

As shown in FIG. 3, a heater 12 may be embedded in the placing table 2 to be positioned under the attracting electrode 11. The wafer W is heated by the heater 12 during film formation by CVD or ALD, for example. A heater power supply 16 is connected to the heater 12 through a power supply line 15, and an output of the heater 12 is controlled based on a detection value of a temperature sensor (not shown) such as a thermocouple or the like, thereby controlling a temperature of the placing table 2.

On the surface of the placing table 2, an annular placing surface 21 on which the wafer W is placed is formed at a position corresponding to the outer periphery of the wafer W.

An attracting surface 22 is formed at an inner side of the placing surface 21 to be positioned lower than the placing surface 21 by about 20 μm to 70 μm. The wafer W is attracted to the attraction surface 22 when the electrostatic chuck is turned on. For example, the attraction surface 22 is an embossed surface that has been subjected to embossing treatment. When the wafer W is attracted to the attracting surface 22 by the electrostatic chuck, the wafer W is brought into close contact with the placing surface 21, which makes it possible to more effectively suppress formation of a deposition film due to the flow of a reactive gas toward the backside of the wafer W in the case of processing the substrate is processed by CVD or ALD. In particular, in the case of forming a conductive film by plasma CVD or plasma ALD, it is possible to suppress a leakage current and arcing due to the formation of a conductive deposition film.

A gas inlet port 24 is formed in the attracting surface 22, and a backside gas supplied from a gas supply source 18 through a gas supply line 17 is supplied from the gas inlet port 24 into a space 23. The gas supply source 18, the gas supply line 17, and the gas inlet port 24 constitute a backside gas supply mechanism. A gas having high thermal conductivity, such as helium (He) gas, is used as the backside gas, and the heat of the placing table 2 is transferred to the wafer W via the backside gas.

An annular guide portion 26 for guiding the wafer W is formed at an outer side of the placing surface 21 that is the surface of the placing table 2. The inner surface of the guide portion 26 is a tapered surface 26a for guiding the wafer W to the placing surface 21 when the wafer W is horizontally displaced. A tapered angle α of the tapered surface 26a shown in FIG. 3 is preferably 50° to 70°, and is 60°, for example. The function of guiding the edge of the wafer W can be effectively exhibited within such a range.

The guide portion 26 has a recess 27 at an inner portion thereof. The placing surface 21 is positioned at the bottom portion of the recess 27 so that the wafer W placed on the placing surface 21 is accommodated in the recess 27. The height of the recess 27, i.e., the height of the upper surface of the guide portion 26 from the placing surface 21, is 0.5 mm to 1 mm, for example.

An annular groove 25 is formed between the placing surface 21 and the guide portion 26. When the processing apparatus performs processing using a gas, a deposition film formed by the gas is accumulated in the groove 25. In particular, when the processing apparatus forms a conductive film, the deposition film is accumulated in the groove 25, thereby suppressing deterioration of the function of the electrostatic chuck due to the adhesion of the conductive deposition film on the placing surface of the wafer W.

Three lift pin insertion holes 28 (only two are shown in FIG. 3) are formed through the placing table 2 in a vertical direction to correspond to the placing surface 21 of the placing table 2. Lift pins 29 are respectively inserted into the lift pin insertion holes 28 to protrude from and retract below the placing surface 21. The lift pins 29 are supported by a support plate 30. The lift pins 29 are raised and lowered via the support plate 30 by a driving mechanism 31 such as an air cylinder or the like. The lift pins 29 are moved between a wafer transfer position protruding from the placing surface 21 and a wafer placing position under the placing surface 21. The wafer W is transferred onto the lift pins 29 at the wafer transfer position, and placed on the placing surface 21 at the wafer placing position.

The vertical movement of the lift pins 29 by the driving mechanism 31 is controlled by an elevation controller 40, thereby controlling the placing operation of the wafer W placed on the lift pins 29 onto the placing surface 21. Other control operations such as voltage application to the attracting electrode 11 or the heater 12 of the substrate placing mechanism 1 are performed by a high-level controller 160 to be described later (not shown in FIGS. 1 to 3).

The electrostatic chuck has a function of correcting warpage of the wafer W that is a substrate. In order to effective correcting the warpage of the wafer W, it is preferable that the wafer W is attracted by the Johnson-Rahbeck force by supplying a power to the attracting electrode 11. The attraction of the wafer W using the Johnson-Rahbeck force is performed by reducing a volume resistivity of a dielectric at a film forming temperature to about $1 \times 10^9 \sim 1 \times 10^{12}$ Ω·cm and by allowing movement of charges. Accordingly, it is possible to increase the amount of accumulated charges and obtain an attractive force stronger than the Coulomb force. By using AlN as a dielectric, the volume resistivity in the above-described range can be obtained, and the Johnson-Rahbeck force can be effectively exhibited.

In the case of using an electrostatic chuck, it is effective that the heater 12 heats the surface of the placing table 2, i.e., the wafer W, to 200° C. or higher. When the heating temperature is 200° C. or higher, the warpage of the wafer W that is a substrate tends to increase, and the function of the electrostatic chuck is further required. The effect can be improved at 400° C. or higher, and within a range of 400° C. to 700° C.

It is not necessary to provide the electrostatic chuck. When the electrostatic chuck is not provided, the attracting electrode 11, the attracting surface 22, and the space 23 are not required, and the entire surface of the wafer W can be placed on the placing surface 21.

<Substrate Placing Method>

Figure 4:
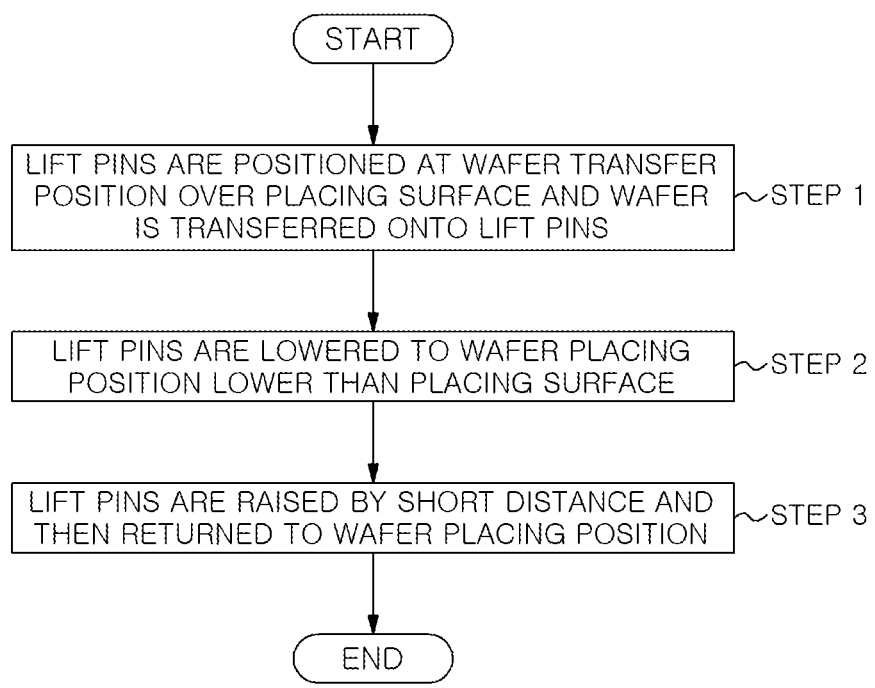
FIG. 4 is a flowchart showing an embodiment of the substrate placing method.

Next, an embodiment of a substrate placing method for placing a wafer W as a substrate on the placing table 2 of the substrate placing mechanism 1 configured as described above will be described with reference to the flowchart of FIG. 4 and the schematic diagrams of FIGS. 5A to 5C. This substrate placing method is performed by controlling the lift pins 29 using the elevation controller 40.

Figure 5A:
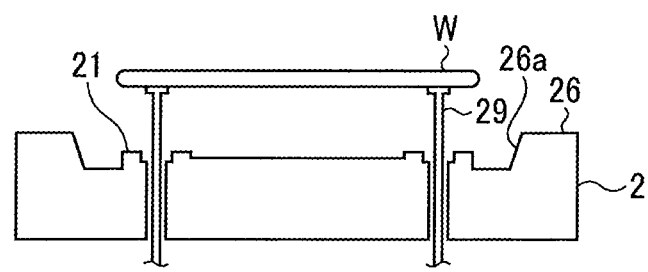
FIGS. 5A to 5C schematically show an embodiment of the substrate placing method.

First, as shown in FIG. 5A, the lift pins 29 are positioned at the wafer transfer position over the placing surface 21 (or at the wafer transfer position protruding upward from the placing surface 21), and the wafer W loaded into a vacuum chamber is transferred onto the lift pins 29 (step 1).

Figure 5B:
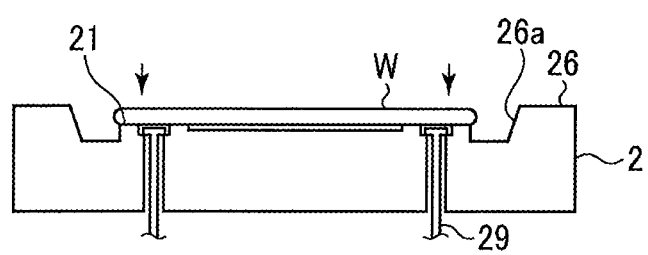

Next, as shown in FIG. 5B, the lift pins 29 are lowered to the wafer placing position lower than the placing surface 21 (step 2). Accordingly, generally, the wafer W is placed on the placing surface 21.

Figure 5C:
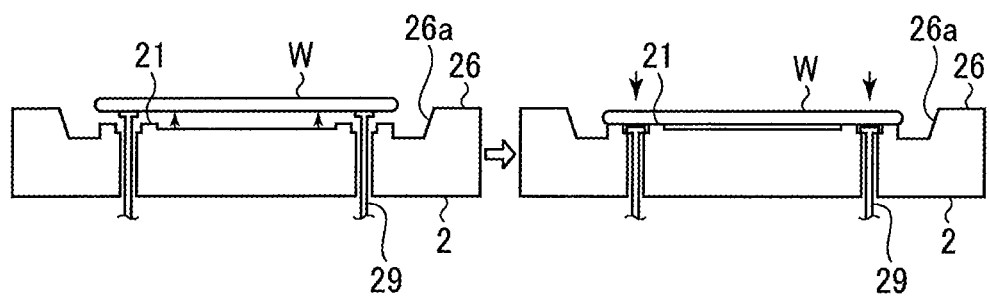

Next, as shown in FIG. 5C, the lift pins 29 are raised by a short distance and then returned to the wafer placing position (step 3).

Hereinafter, the reason for executing the step 3 will be described in detail.

Figure 6:
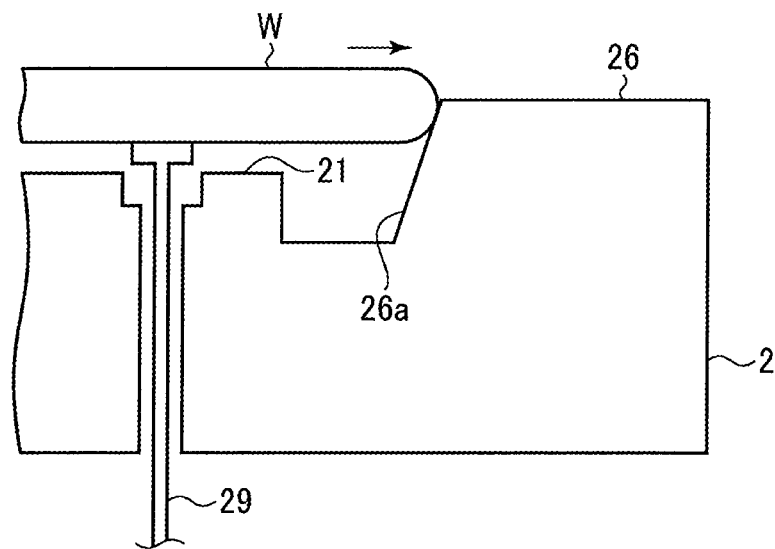
FIG. 6 explains horizontal displacement of a wafer on a lift pin.

During the operation of lowering the lift pins 29 on which the wafer W is placed from the wafer transfer position to the wafer placing position, the wafer W on the lift pins 29 may be slipped and displaced horizontally as shown in FIG. 6 and, thus, the edge of the wafer W may be in contact with the tapered surface 26a of the guide portion 26. This phenomenon tends to occur in the case of performing a film forming process using CVD and ALD at a relatively high pressure. The tapered surface 26a is designed to guide the wafer W when it is in contact with the edge of the wafer W. Therefore, generally, even when the edge of the wafer W is in contact with the tapered surface 26a, the edge of the wafer W slides on the tapered surface 26a due to the weight of the wafer W, and the wafer W is placed on the placing surface.

Figure 7:
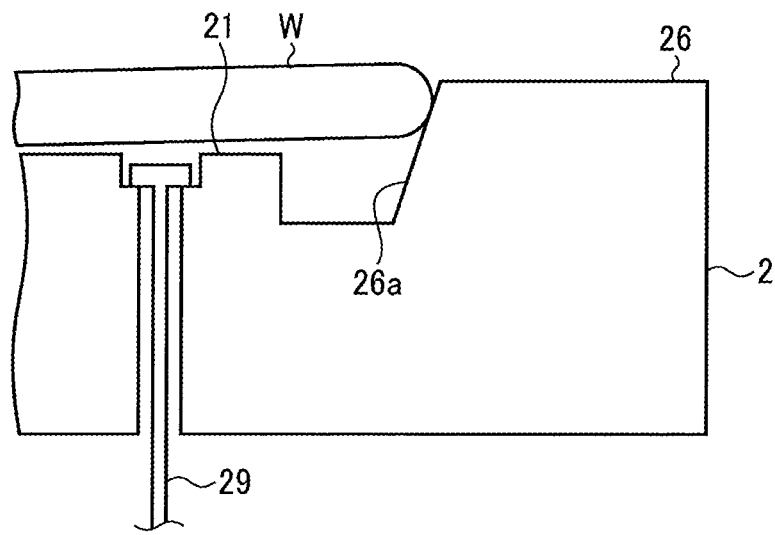
FIG. 7 schematically shows a state in which an edge of a wafer is caught on a tapered surface.

However, the edge of the wafer W may be caught on/locked on the tapered surface 26a, and the wafer W may not be accurately placed on the placing surface 21. It is considered that such a phenomenon occurs when the edge of the wafer W is raised along the tapered surface 26a and caught thereon as shown in FIG. 7 and the frictional resistance locally increases.

Figure 8:
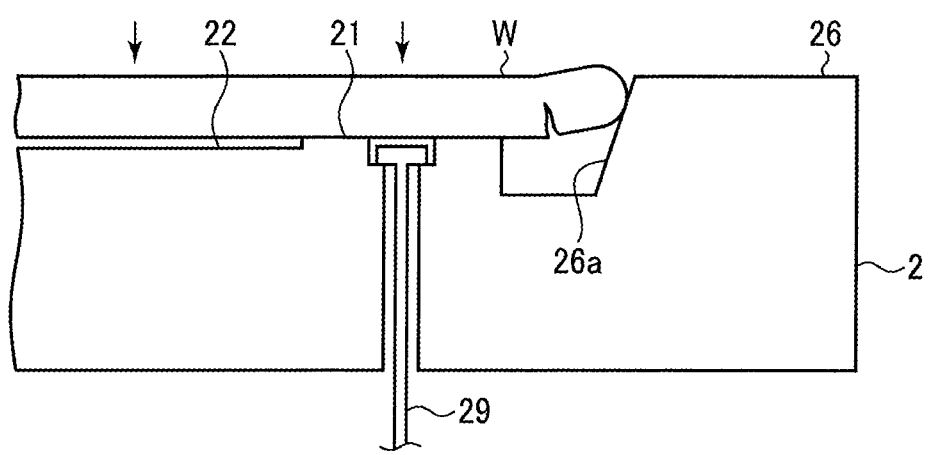
FIG. 8 explains chipping at the time of attracting and holding the wafer in a state where the edge of the wafer is caught on the tapered surface.

When such a phenomenon occurs, various problems are caused. For example, in the case of using an electrostatic chuck, when the wafer W is electrostatically attracted, chipping may occur due to stress applied locally to the portion where the edge of the wafer W is locked on the tapered surface 26a, as shown in FIG. 8. Even in the case where an electrostatic chuck is not used, a space is generated between the backside of the wafer W and the placing surface 21 due to the state in which the edge of the wafer W is caught on the tapered surface 26a, which may lead to the formation of a deposition film on the backside of the wafer W.

Such a phenomenon occurs for 1 out of 1000 wafers. However, such a frequency is a problem in a semiconductor manufacturing process.

Figure 9A:
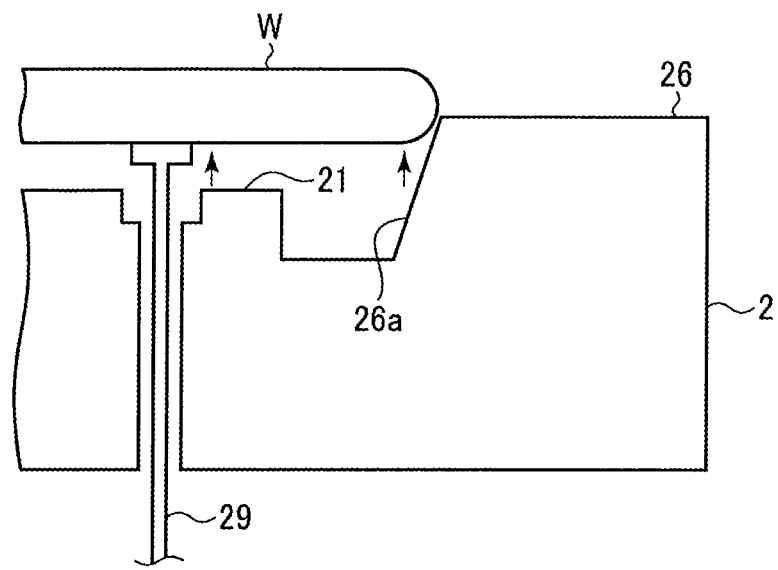
FIGS. 9A and 9B show a mechanism for releasing a state in which the wafer edge is caught on the tapered surface by raising the lift pin by a short distance and then returning the lift pin to a wafer placing position.
Figure 9B:
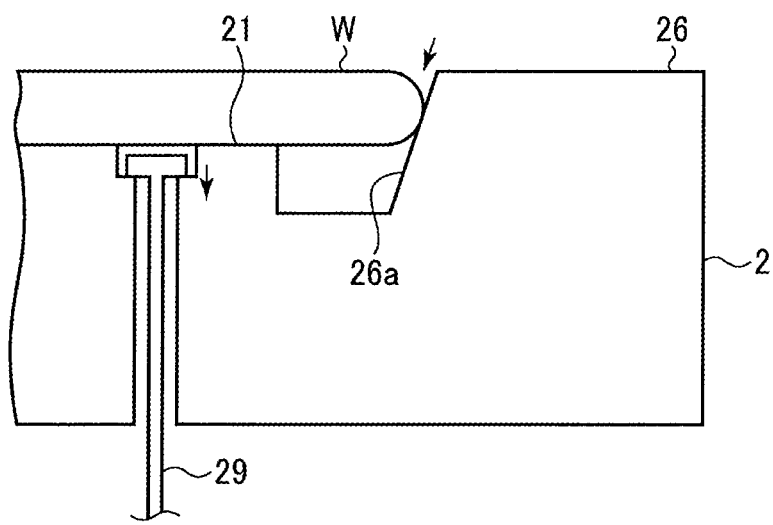

Therefore, in the present embodiment, after the step 2 of lowering the lift pins 29 to the wafer placing position, the step 3 of raising the lift pins 29 by a short distance and then returning the lift pins 29 to the wafer placing position is executed to release the state in which the wafer edge is caught on/locked to the tapered surface. In other words, in the step 3, the lift pins 29 are lifted by a short distance to raise the wafer W caught on the tapered surface 26a as shown in FIG. 9A, so that the edge of the wafer W is separated from the tapered surface 26a and locally high frictional resistance is reset. Then, the lift pins 29 are lowered to the wafer placing position again. The edge of the wafer W slides on the tapered surface 26a, and the wafer W is placed on the placing surface 21 as shown in FIG. 9B.

In the case of using an electrostatic chuck, the wafer W is placed on the placing surface 21, and then is attracted by applying a DC voltage to the attracting electrode 11 of the electrostatic chuck. Since the wafer W can be placed on the placing surface 21 by releasing the state in which the edge of the wafer W is caught on the tapered surface 26 by the step 3 as described above, the local chipping of the wafer edge can be prevented at the time of electrostatically attracting the wafer W.

Even in the case where an electrostatic chuck is not used, it is possible to prevent the formation of a deposition film on the backside of the wafer W due to the formation of the space between the backside of the wafer W and the placing surface 21.

The lifting distance (short distance) of the lift pins 29 in the step 3, i.e., the stroke for raising the wafer W, needs to be a value capable of releasing the state in which the edge of the wafer W is caught on the tapered surface 26a.

Therefore, it is preferable that the lifting distance of the lift pins 29 is 1 mm or more. If the lifting distance of the lift pins 29 is too large, the tact time is affected. Hence, in order to prevent the influence on the tact time, it is preferable that the lifting distance of the lift pins 29 is 3 mm or less. In that case, the time required to raise the lift pins and then lower the lift pins again is about 1 sec or less, and the tact time is hardly affected. Accordingly, in the step 3, the lifting distance of the lift pins 29 is preferably 1 mm to 3 mm.

Although this step is required only for the wafers whose edge is caught on the tapered surface 26a, it is preferable to perform this step for all wafers W. Thus, it is unnecessary to provide a device for detecting the state in which the edge of the wafer W is caught or to change the step depending on wafers. Accordingly, this step can be executed in a simple manner.

Figure 10:
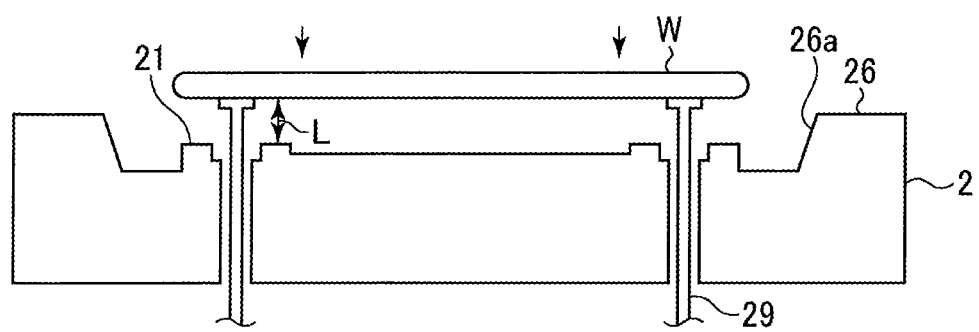
FIG. 10 shows a substrate state during pre-heating.

If necessary, as shown in FIG. 10, the lift pins 29 are stopped during the operation, and the wafer W is made to be close to the placing surface 21. In that state, the pre-heating of the wafer W may be performed by supplying an inert gas such as Ar gas, as a thermally conductive gas, into the chamber. The distance between the wafer W and the placing surface 21 at this time is set to 0.5 mm to 1 mm, e.g., 1 mm.

A pressure in the chamber at the time of placing the wafer W on the placing surface 21 is preferably 13.3 Pa (0.1 Torr) or less. In order to place the wafer W on the placing surface 21, the lift pins 29 on which the wafer W is placed are lowered. If the pressure in the chamber immediately before the wafer W is placed on the placing surface 21 is higher than 13.3 Pa (0.1 Torr), the wafer W is likely to be displaced horizontally when it is placed on the placing surface 21. In other words, by setting the pressure in the chamber at 13.3 Pa (0.1 Torr) or less at the time of placing the wafer W on the placing surface 21, the effect of suppressing the horizontal displacement of the wafer W can be obtained.

The pressure in the chamber may be set to a low level at the beginning of the wafer placing sequence. In the case of performing pre-heating, after the pre-heating, the pressure in the chamber may be set to a low level in a state where the wafer W is made to be close to the placing surface 21 by stopping the lift pins 29 during lowering the lift pins 29. Even in the case where the pre-heating is not performed, the pressure in the chamber may be set to a low level after the lift pins 29 are stopped during the operation.

<Substrate Processing Apparatus>

Next, a substrate processing apparatus to which the above-described substrate placing mechanism is applied will be described.

Figure 11:
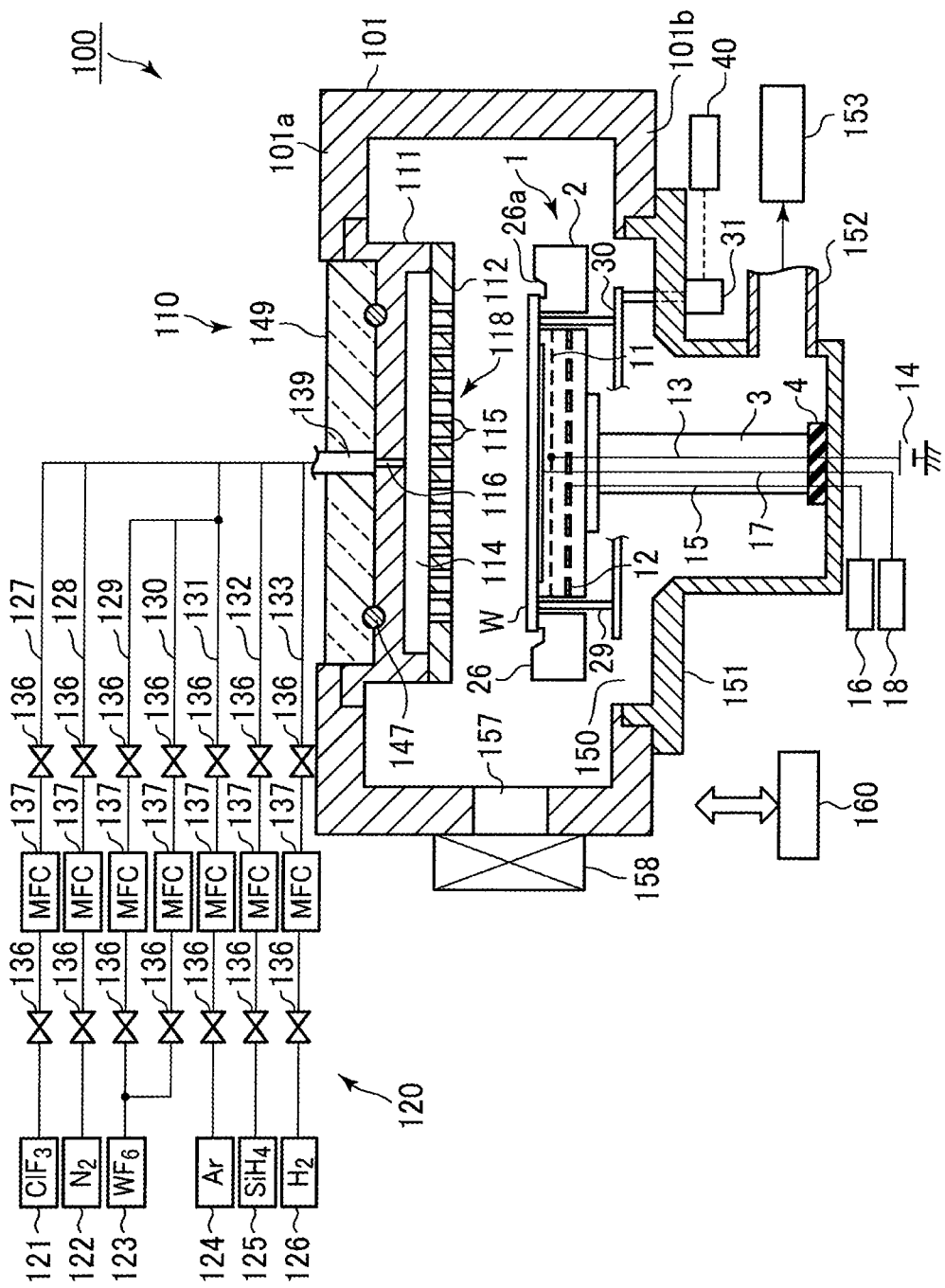
FIG. 11 is a cross-sectional view showing a substrate processing apparatus to which a substrate placing mechanism is applied.

FIG. 11 is a cross-sectional view showing a substrate processing apparatus.

The substrate processing apparatus 100 is configured as a film forming apparatus for forming a tungsten (W) film by CVD.

This substrate processing apparatus 100 has a substantially cylindrical chamber 101 made of a metal. The chamber 101 has an exhaust space 151 protruding downward to cover a circular hole 150 formed at the central portion of a bottom wall 101b of the main body. An exhaust line 152 is connected to the side surface of the exhaust space 151, and is provided with an exhaust device 153 having a pressure control valve and a vacuum pump. The exhaust device 153 can exhaust the chamber 101 and control a pressure in the chamber 101 to a predetermined pressure.

A loading/unloading port 157 for loading/unloading the wafer W into/from a wafer transfer chamber (not shown) disposed adjacent to the chamber 101, and a gate valve 158 for opening/closing the loading/unloading port 157 are provided on the sidewall of the chamber 101.

The substrate placing mechanism 1 configured as described above is disposed in the chamber 101. The support member 3 of the substrate placing mechanism 1 is attached to the bottom wall of the exhaust space 151 via the insulating member 4. A driving mechanism 31 for raising and lowering the lift pins 29 is attached to the outer side of the exhaust space 151.

A shower head 110 is disposed on a ceiling wall 101a of the chamber 101 to face the placing table 2 of the substrate placing mechanism 1. The shower head 110 functions as a gas introducing member. The shower head 110 has a base member 111 and a shower plate 112, and the outer peripheral portion of the shower plate 112 is screwed to the base member 111. A gas diffusion space 114 is formed between the base member 111 and the shower plate 112. The base member 111 is supported by the ceiling wall 101a. The shower plate 112 has a gas injection surface 118 facing the placing table 2, and a plurality of gas injection holes 115 are formed in the shower plate 112. One gas inlet hole 116 is formed near the center of the base member 111. A gas line of a gas supply mechanism 120 to be described later is connected to the gas inlet hole 116, and a processing gas supplied from the gas supply mechanism 120 is introduced into the chamber 101 through the shower head 110 in a shower pattern.

A heater 147 for heating the shower head 110 is disposed at the base member 111 of the shower head 110. A power is supplied from a heater power supply (not shown) to the heater 147, so that the shower head 110 is heated to a desired temperature. A heat insulating member 149 is disposed in a recess formed at the upper portion of the base member 111.

The gas supply mechanism 120 has a $ClF_3$ gas supply source 121, an $N_2$ gas supply source 122, a $WF_6$ gas supply source 123, an Ar gas supply source 124, an $SiH_4$ gas supply source 125, and an $H_2$ gas supply source 126. $ClF_3$ gas is used as a cleaning gas. $WF_6$ gas is used as a W source gas. $SiH_4$ gas and $H_2$ gas are used as reducing gases. $N_2$ gas and Ar gas are used as a carrier gas and a purge gas.

A gas line 127 is connected to the $ClF_3$ gas supply source 121. A gas line 128 is connected to the $N_2$ gas supply source 122. A gas line 129 is connected to the $WF_6$ gas supply source 123, and a branch line 130 is branched from the gas line 129. The branch line 130 is used in a nucleation process to be described later, and is configured to strictly control a flow rate. A gas line 131 is connected to the Ar gas supply source 124. The gas line 129 and the branch line 130 join to the gas line 60. A gas line 132 is connected to the $SiH_4$ gas supply source 125. A gas line 133 is connected to the $H_2$ gas supply source 126. The gas lines 127, 128, 131, 132, and 133 are connected to a common gas line 139, and the common gas line 139 is connected to the above-described gas inlet hole 116. The gas reaches the gas diffusion space 114 through the gas inlet hole 116, and is injected toward the wafer W in the chamber 101 in a shower pattern through the gas injection holes 115 of the shower plate 112.

Each of the gas lines 127, 128, 129, 130, 131, 132, and 133 is provided with a mass flow controller 137 as a flow rate controller and two opening/closing valves 136 disposed on both sides of the mass flow controller 137. The flow rate controller is not limited to the mass flow controller 137.

The substrate processing apparatus 100 includes the controller 160 for controlling the valves 136, the mass flow controller 137, a matching box 140, a radio frequency power supply 141, the DC power supply 14 or the elevation controller 40 of the substrate placing mechanism 1, the heater power supply 16, and the like. The controller 160 has a CPU (computer), and includes a main controller for controlling the above-described individual components, an input device, an output device, a display device, and a storage device. A storage medium storing a program, i.e., a processing recipe, for controlling processing performed in the substrate processing apparatus 100 is set in the storage device. The controller calls a predetermined processing recipe stored in the storage medium, and controls the substrate processing apparatus 100 to perform predetermined processing based on the processing recipe.

Next, W film formation using the substrate processing apparatus 100 will be described.

Here, a typical example of forming a W thin film on a TiN thin film that has been formed as a barrier layer on the wafer W in advance will be described.

First, before the wafer W is loaded into the chamber 101, a pre-coating process in the chamber 101 is performed. The chamber 11 is preferably heated to 350° C. to 450° C., and the same processes as an initiation process to be described later, the nucleation process, and the W film forming process are sequentially performed under the same conditions, thereby forming a pre-coat film on the inner wall of the chamber 101 or the surfaces of the placing table 2, the shower head 110, and the like.

After the pre-coating process is completed, the chamber 101 is purged with Ar gas and $N_2$ gas. Next, a pressure in the chamber 101 is adjusted and, then, the gate valve 158 is opened so that the wafer W is transferred from the vacuum transfer chamber (not shown) into the chamber 101 through the loading/unloading port 157 by the transfer mechanism (not shown) and placed on the placing surface 21 of the placing table 2 maintained at a predetermined temperature by the heater 12.

In order to place the wafer W on the placing surface 21 of the placing table 2, the lift pins 29 are located at the wafer transfer position over the placing surface 21, and the wafer W is transferred onto the lift pins 29 as described above.

Next, the movement of the lift pins 29 is stopped, and in a state where the wafer W is close to the placing surface 21, the wafer W is pre-heated by supplying Ar gas as a thermally conductive gas into the chamber. Next, in a state where the wafer W is held at the same position, the chamber 101 is exhausted to reduce a pressure therein to 13.3 Pa (0.1 Torr) or less. Accordingly, the horizontal displacement of the wafer W on the lift pins 29 is suppressed. Next, the lift pins 29 are lowered to the wafer placing position lower than the placing surface 21. Then, the step of raising the lift pins 29 by a short distance and then returning the lift pins 29 to the wafer placing position is executed. As described above, by executing this step, the wafer W whose edge is displaced horizontally and caught on the tapered surface 26a due to the horizontal displacement of the wafer W on the lift pins 29 can be placed on the placing surface 21.

First, the wafer W placed on the placing table 2 is subjected to the initiation process for suppressing abnormal grain growth of the W film to be formed later and obtaining a desired surface state. In the initiation process, $SiH_4$ gas and $H_2$ gas are supplied into the chamber 101 through the shower head 110 to adsorb SiHx (e.g., x=1 to 3) on the TiN film.

After the initiation process, $WF_6$ gas, Ar gas, $H_2$ gas and $N_2$ gas are supplied into the chamber 101 to perform the nucleation process. In the nucleation process, nucleation of W is performed while strictly controlling the flow rate of $WF_6$ gas to be smaller than that in the film forming process by the mass flow controller 137 of the branch line 130, which can strictly control the flow rate, branched from the gas line 129.

Next, in a state where Ar gas, $H_2$ gas, and $N_2$ gas are supplied, the branch line 130 is switched to the gas line 129 that is the main line, and the $WF_6$ gas is supplied at a flow rate higher than that in the nucleation process, thereby performing the W film formation.

In the nucleation process and the film forming process the heating temperature is preferably 380° C. to 500° C.

After the film forming process is performed for a predetermined period of time, the valve of the gas line 129 is closed, and the supply of the $WF_6$ gas from the $WF_6$ gas supply source 123 is stopped, thereby completing the film forming process.

Then, the chamber 101 is purged with Ar gas. Next, the wafer W is lifted up by the lift pins 16, and unloaded from the chamber 11 by the transfer arm.

After the above steps are repeated for a predetermined number of wafers W, $ClF_3$ gas is supplied into the chamber 11 to clean the chamber. After the cleaning, the pre-coating process is performed again, and the above-described processes are repeated.

In the process of forming the W film on the wafer W by the substrate processing apparatus 100 as described above, in order to place the wafer W on the placing table 2, the step of raising the lift pins 29 by a short distance and then returning the lift pins 29 to the wafer placing position is executed. Accordingly, the state in which the edge of the wafer W is caught on the tapered surface 26a, if occurs, can be released. Hence, when the wafer W is electrostatically attracted on the placing table 2 by the electrostatic chuck, it is possible to prevent the occurrence of chipping caused by local stress at the edge of the wafer W.

The W film forming process is performed by the substrate processing apparatus 100 at a high temperature of 380° C. to 500° C., so that the warpage of the wafer W may be caused. However, the warpage of the wafer W may be avoided by electrostatically attracting the wafer W using the electrostatic chuck. Therefore, it is possible to solve the problems caused by the warpage of the wafer W, such as deterioration of the uniformity of processing, adhesion of deposits between the wafer W and the placing table 2, and the like.

OTHER APPLICATIONS

While the embodiments of the present disclosure have been described, the embodiments of the present disclosure are illustrative in all respects and are not restrictive. The above-described embodiments may be omitted, replaced, or changed in various forms without departing from the scope of the appended claims and the gist thereof.

For example, in the above-described embodiments, the substrate placing mechanism for performing the substrate placing method has an electrostatic chuck. However, the substrate placing mechanism may not have an electrostatic chuck.

Although the film forming apparatus for forming a W film by CVD has been described as an example of the substrate processing apparatus to which the substrate placing method is applied, the present disclosure is not limited thereto. For example, a film to be formed is not limited to the W film, and it is not necessary to use the film forming apparatus. Further, in the above-described embodiments, the substrate processing apparatus that does not use plasma has been described as an example. However, the substrate processing apparatus may use plasma.

The substrate placing mechanism is not limited to the configuration of the above embodiment. For example, in the above-described embodiments, an example in which the placing table as the substrate placing mechanism is supported by the supporting member has been described. However, the placing table may be directly disposed on the bottom portion of the chamber without providing the supporting member.

Further, although an example using a semiconductor wafer as a substrate has been described, the substrate is not limited to a wafer, and may be another substrate such as an FPD substrate, a ceramic substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate placing method for placing a substrate on a placing surface of a placing table in a chamber of a substrate processing apparatus for processing a substrate, the placing table having the placing surface on which a substrate is placed and a tapered surface for guiding the substrate disposed at an outer periphery of the placing surface, the method comprising,
   locating a lift pin to a substrate transfer position over the placing surface, the lift pin being capable of protruding from and retracting below the placing surface, and transferring the substrate onto the lift pin;
   lowering the lift pin, on which the substrate is placed, to a substrate placing position lower than the placing surface; and
   raising the lift pin by a short distance and then returning the lift pin to the substrate placing position,
   wherein when an edge of the substrate is caught on the tapered surface while lowering the lift pin from the substrate transfer position to the substrate placing position, a state in which the edge is caught on the tapered surface is released and the substrate is guided to the placing surface, by said raising the lift pin by the short distance and then returning the lift pin to the substrate placing position.

2. The substrate placing method of claim 1, wherein the placing table has an electrostatic chuck configured to electrostatically attract the substrate, and
   the method further comprises electrostatically attracting the substrate using the electrostatic chuck after said raising the lift pin by the short distance and then returning the lift pin to the wafer placing position.

3. The substrate placing method of claim 2, wherein the placing table has a heater, and the substrate is heated on the placing table to 200° C. or higher by the heater.

4. The substrate placing method of claim 3, further comprising:
   stopping the lift pin on which the substrate is placed while lowering the lift pin to the substrate placing position so that the substrate is made to be close to the placing surface; and
   supplying a thermally conductive gas into the chamber and pre-heating the substrate.

5. The substrate placing method of claim 4, further comprising, after said pre-heating the substrate:
   setting a pressure in the chamber to 13.3 Pa or less in a state where the substrate is made to be close to the placing surface.

6. The substrate placing method of claim 1, wherein a pressure in the chamber is set to 13.3 Pa or less when the substrate is placed on the placing surface.

7. The substrate placing method of claim 1, wherein the short distance is a value that allows the state in which the edge is caught on the tapered surface to be released.

8. The substrate placing method of claim 7, wherein the short distance is 1 mm or more.

9. The substrate placing method of claim 8, wherein the short distance is 1 to 3 mm.

* * * * *